(12) United States Patent
Huang et al.

(10) Patent No.: US 10,989,613 B2
(45) Date of Patent: Apr. 27, 2021

(54) PRESSURE SENSOR ENHANCING VARIATION PERCENTAGES UNDER HIGH PRESSURES

(71) Applicant: TAIWAN ALPHA ELECTRONIC CO., LTD., Taoyuan (TW)

(72) Inventors: Tzu-Hsuan Huang, Taoyuan (TW); Wei-Liang Liu, Taoyuan (TW); Huang-Chao Chan, Taoyuan (TW)

(73) Assignee: TAIWAN ALPHA ELECTRONIC CO., LTD., Taoyuan (TW)

( * ) Notice: Subject to any disclaimer, the term of this patent is extended or adjusted under 35 U.S.C. 154(b) by 48 days.

(21) Appl. No.: 16/415,766

(22) Filed: May 17, 2019

(65) Prior Publication Data
US 2019/0376853 A1   Dec. 12, 2019

(30) Foreign Application Priority Data
Jun. 8, 2018 (TW) ................ 107119878

(51) Int. Cl.
| | |
|---|---|
| *G01L 1/20* | (2006.01) |
| *H05K 1/14* | (2006.01) |
| *H05K 1/11* | (2006.01) |
| *G01D 21/02* | (2006.01) |
| *H05K 1/03* | (2006.01) |

(52) U.S. Cl.
CPC ............ *G01L 1/205* (2013.01); *G01D 21/02* (2013.01); *H05K 1/03* (2013.01); *H05K 1/111* (2013.01); *H05K 1/144* (2013.01); *H05K 2201/042* (2013.01); *H05K 2201/09209* (2013.01); *H05K 2201/10151* (2013.01)

(58) Field of Classification Search
CPC ......... G06F 3/044; G01L 1/205; G01D 21/02; H05K 1/03; H05K 1/111; H05K 1/144; H05K 2201/042; H05K 2201/09209; H05K 2201/10151
USPC .......................................... 73/862
See application file for complete search history.

(56) References Cited

U.S. PATENT DOCUMENTS

| | | | |
|---|---|---|---|
| 7,113,179 B2 * | 9/2006 | Baker ............... | G01L 1/205 178/18.05 |
| 8,618,720 B2 * | 12/2013 | Paleczny .............. | G06F 3/016 310/344 |

(Continued)

*Primary Examiner* — Octavia Hollington
(74) *Attorney, Agent, or Firm* — Muncy, Geissler, Olds & Lowe, P.C.

(57) ABSTRACT

A pressure sensor includes a conductive substrate, a ring-shaped spacer, an inner spacer and a sensing circuit substrate. The conductive substrate includes a conductive-substrate body and a conductive layer. The conductive layer is disposed on the conductive-substrate body. The ring-shaped spacer and the inner spacer are disposed on the conductive-substrate body. The sensing-circuit substrate, disposed on the ring-shaped spacer and the inner spacer, includes a circuit-substrate body, a first sensing circuit and a second sensing circuit. The first sensing circuit and the second sensing circuit are disposed on opposing sides of the circuit-substrate body, and a plurality of first finger circuits of the first sensing circuit and a plurality of second finger circuits of the second sensing circuit are interlaced. The first sensing circuit and the second sensing circuit are densely arranged at the center of the conductive layer and less densely arranged on both sides of the conductive layer.

7 Claims, 15 Drawing Sheets

(56) References Cited

U.S. PATENT DOCUMENTS

| | | | |
|---|---|---|---|
| 8,749,493 B2* | 6/2014 | Zadesky | G06F 3/041 |
| | | | 345/173 |
| 9,352,456 B2* | 5/2016 | Murthy | B25B 23/147 |
| 9,514,866 B2* | 12/2016 | Huang | H01C 1/14 |
| 10,459,542 B1* | 10/2019 | Costante | G06F 3/044 |

* cited by examiner

PRESSURE SENSOR ENHANCING VARIATION PERCENTAGES UNDER HIGH PRESSURES

This application claims the benefit of Taiwan Patent Application Serial No. 107119878, filed Jun. 8, 2018, the subject matter of which is incorporated herein by reference.

BACKGROUND OF THE INVENTION

(1) Field of the Invention

The invention relates to a pressure sensor, and more particularly to the pressure sensor that introduces a central sensing region formulated by a predetermined arrangement of finger circuits and spacers to enhance variation percentages under high pressures.

(2) Description of the Prior Art

Generally speaking, in order to inspect whether or not forcing upon the user during an exercise can distribute uniformly, or whether or not the forcing is concentrated at a particular spot, a pressure sensor is usually applied for detection. For example, in the case that distribution of forcing upon the feet of a user or a runner is detected, a plurality of pressure sensors are arranged to the shoe pads, so that a plurality of application spots between the feet and the pads can be detected. In addition, except for the aforesaid usage, the pressure sensors at the shoe pads may be applied to determine whether or not the forcing to the feet is unevenly affected by the structuring of the shoes.

Refer now to FIG. 1 to FIG. 3; where FIG. 1 is a schematic exploded view of a conventional pressure sensor, FIG. 2 is another view of FIG. 1, and FIG. 3 demonstrates schematically and planarly relative position relationships between the sensor circuits and the spacers of the conventional pressure sensor of FIG. 1. As shown, a conventional pressure sensor PA100 includes a conductive substrate PA1, a ring-shaped spacer PA2, an inner spacer PA3 and a sensing circuit substrate PA4.

The conductive substrate PA1 includes a conductive-substrate body PA11 and a conductive layer PA12. The conductive layer PA12 is furnished to the conductive-substrate body PA11. The ring-shaped spacer PA2, disposed on the conductive-substrate body PA11, is to expose the conductive layer PA12 therethrough. The inner spacer PA3, spaced from the ring-shaped spacer PA2, is disposed on the conductive layer PA12.

The sensing circuit substrate PA4, disposed to top both the ring-shaped spacer PA2 and the inner spacer PA3, includes a circuit-substrate body PA41, a first sensing circuit PA42 and a second sensing circuit PA43. The circuit-substrate body PA41 is to face the conductive layer PA12.

The first sensing circuit PA42 includes a first bus circuit PA421 and a plurality of first finger circuits PA422 (only one labeled in the figure). The first bus circuit PA421 is extended along one side of the circuit-substrate body PA41, and the first finger circuits PA422 are extended from the first bus circuit PA421 toward another side of the circuit-substrate body PA41.

The second sensing circuit PA43 includes a second bus circuit PA431 and a plurality of second finger circuits PA432 (only one labeled in the figure). The second bus circuit PA431 is extended along another side of the circuit-substrate body PA41 by opposing to the side that locates the first bus circuit PA421. Similarly, a plurality of second finger circuits PA432 are extended form the second bus circuit PA431 toward the side having the first bus circuits PA421. As shown, the first finger circuits PA422 and the second finger circuits PA422 are arranged in a staggered manner. Upon such an arrangement, as an object depresses at the conductive substrate PA1 or the sensing circuit substrate PA4, then the first sensing circuit PA42 and the second sensing circuit PA43 would individually and electrically connect the conductive layer PA12, such that the first sensing circuit PA42 and the second sensing circuit PA43 would be connected, and a corresponding voltage variation would be generated. For example, for the pressure sensor PA100 to be within 2~6 bars, the variation percentage would be around 22.6% (computed by (Pressure detected at 2 bar subtracts Pressure detected at 6 bar) to be divided by (Pressure detected at 2 bar)), while the variation percentage would be around 15.4% for the pressure within 4~8 bar.

As mentioned, though the conventional pressure sensor can detect the pressure variations, yet the variation percentage at the high pressure is not significant. Namely, the applicable range of the conventional pressure sensor is limited.

SUMMARY OF THE INVENTION

In view that the conventional pressure sensor is less sensitive to high pressures and so the application thereof is limited, accordingly it is an object of the present invention to provide a pressure sensor, that sensing sensitivity at high pressures can be increased via relevantly arranging spacers and finger circuits of the sensor circuit.

In this invention, the pressure sensor includes a conductive substrate, a ring-shaped spacer, an inner spacer and a sensing circuit substrate.

The conductive substrate includes a conductive-substrate body and a conductive layer. The conductive-substrate body has a conductive-layer disposing surface. The conductive layer, disposed on the conductive-layer disposing surface, has a central sensing region and two outer sensing regions located to opposing sides of the central sensing region.

The ring-shaped spacer is disposed on the conductive-substrate body to make the conductive layer exposed from the ring-shaped spacer. The inner spacer, disposed on the conductive layer, separated from the ring-shaped spacer to form two outer sensing spaces exposed respectively from the two outer sensing regions and at least one central sensing space exposed from the central sensing region.

The sensing circuit substrate, disposed on the ring-shaped spacer and the inner spacer, includes a circuit-substrate body, a first sensing circuit and a second sensing circuit.

The circuit-substrate body, extending from a first end to a second end in a first direction, has a circuit-disposing surface facing the conductive-layer disposing surface and disposed on the ring-shaped spacer and the inner spacer.

The first sensing circuit includes a first bus circuit and a plurality of first finger circuits. The first bus circuit is disposed along a side of the circuit-disposing surface by extending from the first end to the second end. The first finger circuits extend individually out from the first bus circuit in a second direction perpendicular to the first direction, and are distributed respectively in the central sensing region and the two outer sensing regions. In the two outer sensing regions, the first finger circuit has a first spacing. In the central sensing region, the first finger circuit has a second spacing. The second spacing is smaller than the first spacing.

The second sensing circuit includes a second bus circuit and a plurality of second finger circuits. The second bus circuit is disposed along another side of the circuit-disposing surface by extending from the first end to the second end. The second finger circuits extend individually out from the second bus circuit in a direction reverse to the second direction to be integrated into a staggered arrangement with the first finger circuits, and are distributed respectively in the central sensing region and the two outer sensing regions. In the two outer sensing regions, the second finger circuit has a first spacing. In the central sensing region, the second finger circuit has a second spacing.

In the present invention, an arrangement density of the first finger circuits and the second finger circuits in the central sensing region is larger than that in the two outer sensing regions.

In one embodiment of the present invention, the inner spacer includes a first-end portion, a second-end portion, a first lateral portion and a second lateral portion, the first-end portion and the second-end portion are respectively furnished to the two outer sensing regions, the first lateral portion and the second lateral portion are furnished to the central sensing region by spacing to each other, and the at least one central sensing space is enclosed on the central sensing region by the first-end portion, the second-end portion, the first lateral portion, the second lateral portion and the ring-shaped spacer.

Preferably, the first lateral portion and the second lateral portion are individually integrated as a unique piece with the first-end portion and the second-end portion, respectively.

Also, preferably, the inner spacer further includes a central portion located separately between the first lateral portion and the second lateral portion, and the central portion is further integrated as a unique piece with the first-end portion and the second-end portion.

In one embodiment of the present invention, the second finger circuits and the first finger circuits in the two outer sensing regions are integrated into the staggered arrangement with a first spacing, and the second finger circuits and the first finger circuits in the central sensing region are integrated into the staggered arrangement with a second spacing smaller than the first spacing.

In one embodiment of the present invention, each of the second finger circuits and the first finger circuits in the two outer sensing regions has a first width, each of the second finger circuits and the first finger circuits in the central sensing region has a second width, and the second width is smaller than the first width.

As stated, since the pressure sensor provided by the present invention divides the conductive layer into the central sensing region and the outer sensing regions located at opposing sides of the central sensing region, the first finger circuits and the second finger circuits on the outer sensing regions are arranged in one staggered manner with one first width and one first spacing, and those on the central sensing region are arranged in another staggered manner with a second width smaller than the first width and a second spacing smaller than the first spacing, thus a denser staggered arrangement is assigned for the first finger circuits and the second finger circuits on the central sensing region, and a less dense staggered arrangement is assigned for those on the outer sensing regions. Thereupon, while the pressure sensor in testing, even if the pressure upon the object to be tested is hard to depress the first finger circuits and the second finger circuits (or the conductive layer) down to deflect through the central sensing region to touch the conductive layer (or the first finger circuits and the second finger circuits), the variation percentage of the pressure sensor for high-pressure testing according to the present invention can be still kept high.

All these objects are achieved by the pressure sensor described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a pressure sensor. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
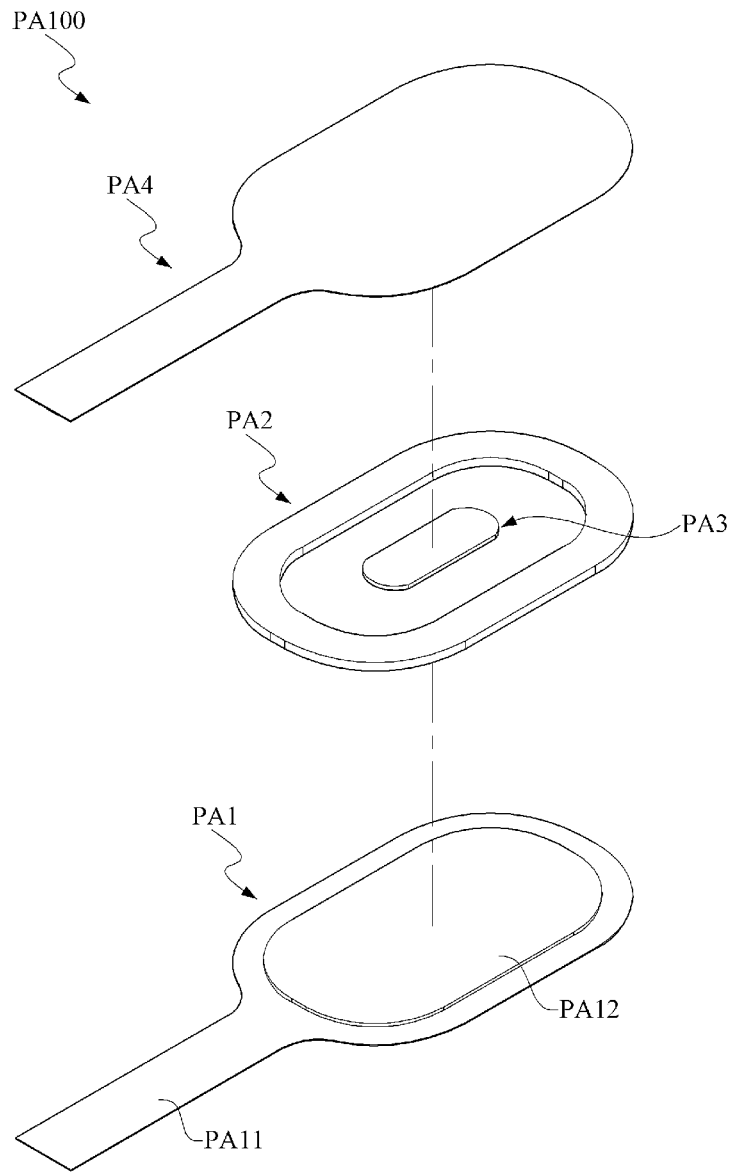
FIG. 1 is a schematic exploded view of a conventional pressure sensor.
Figure 2:
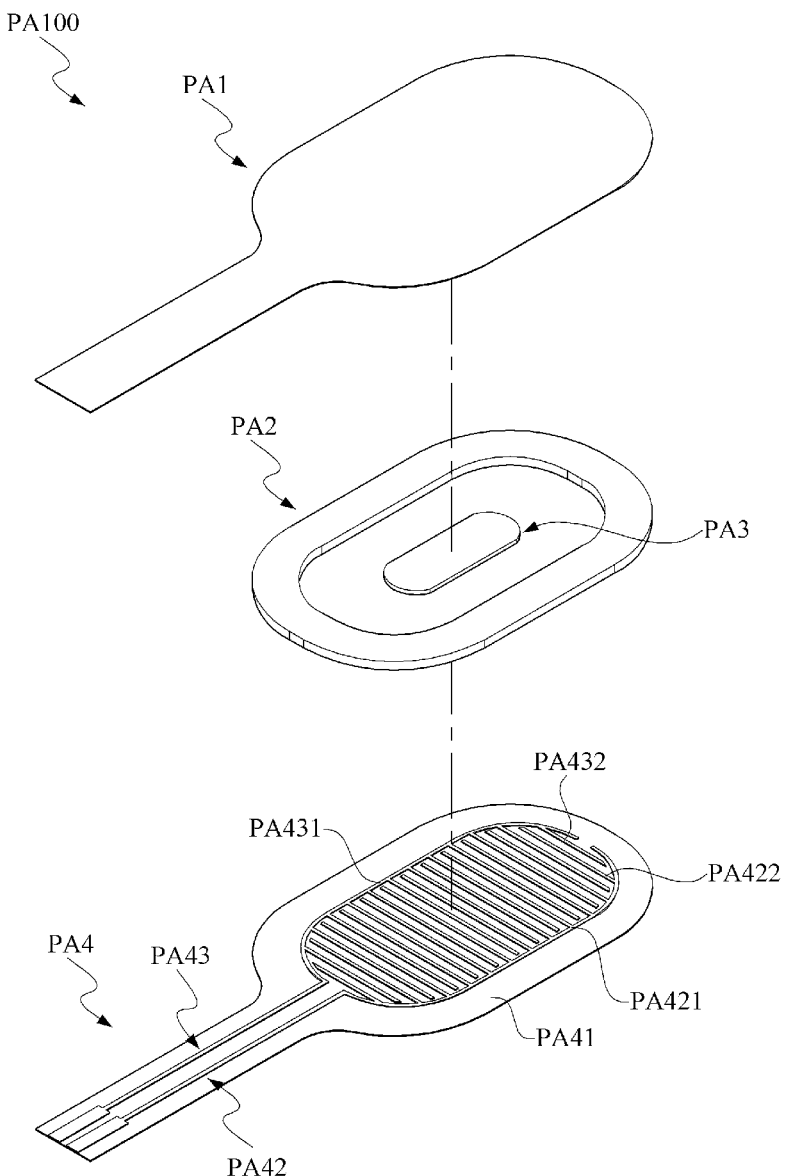
FIG. 2 is another view of FIG. 1.
Figure 3:
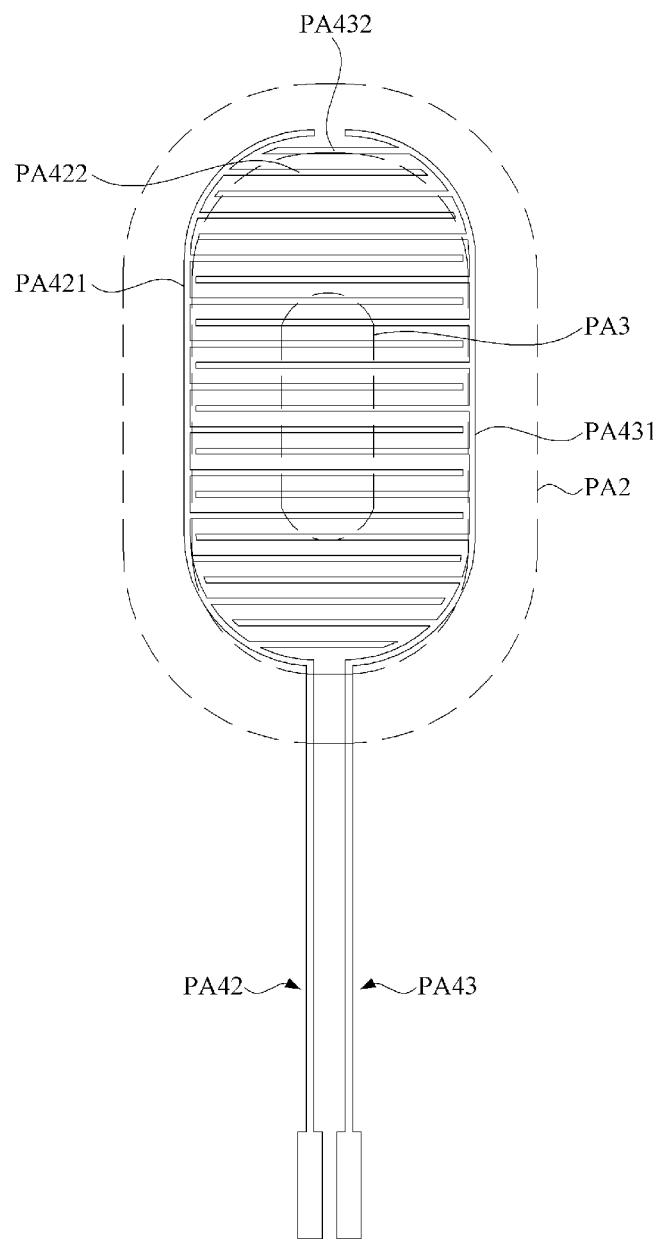
FIG. 3 demonstrates schematically and planarly relative position relationships between the sensor circuits and the spacers of the conventional pressure sensor of FIG. 1.
Figure 4:
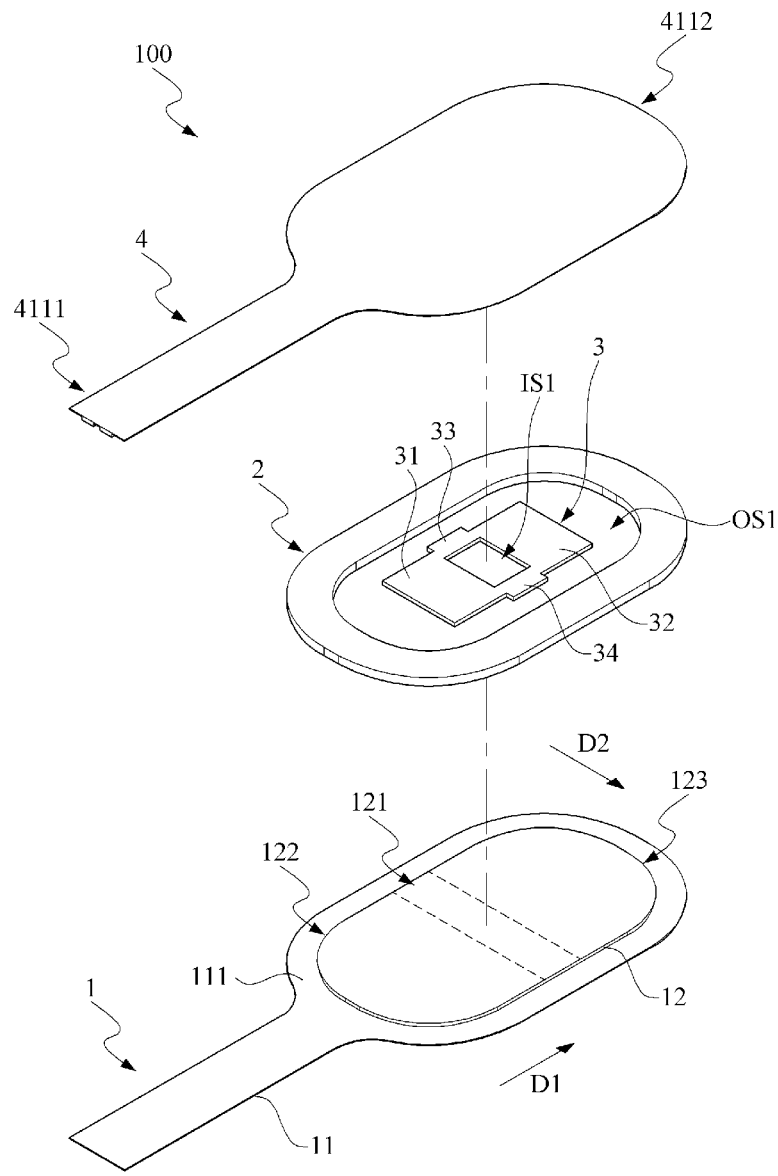
FIG. 4 is a schematic exploded view of a first embodiment of the pressure sensor in accordance with the present invention.
Figure 5:
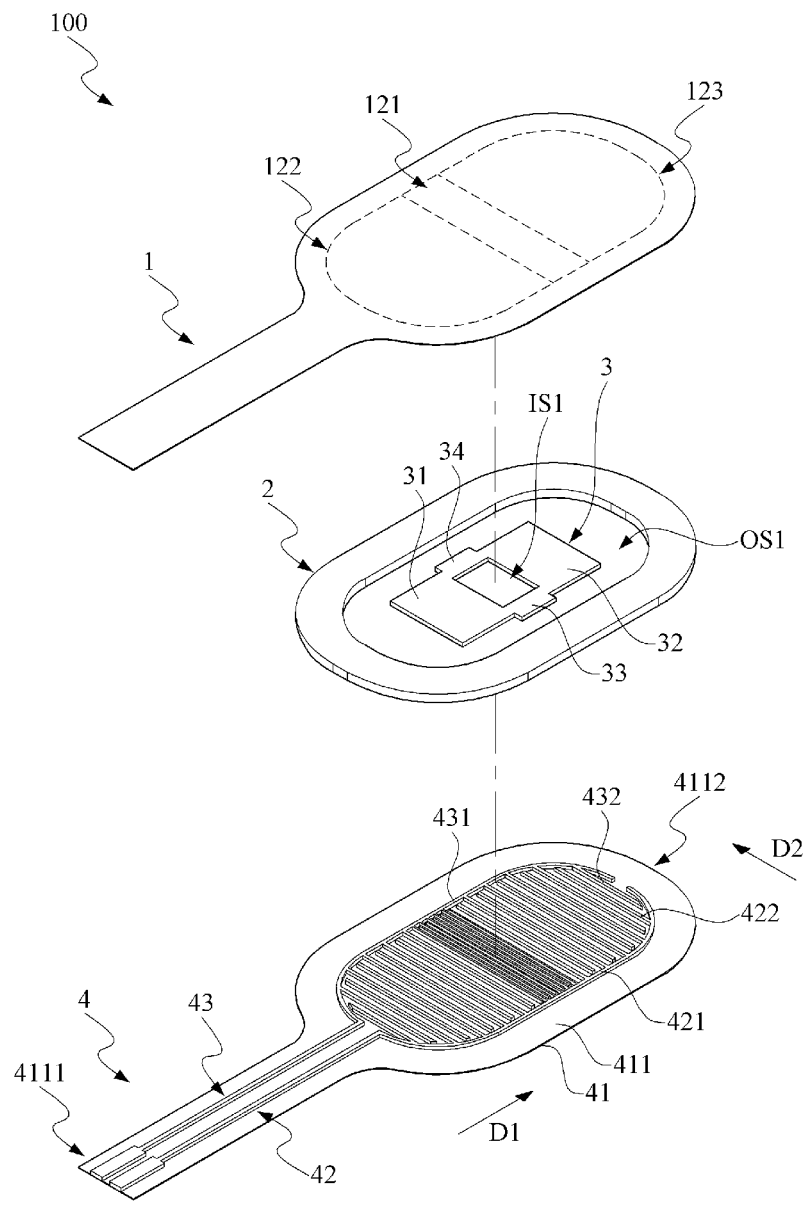
FIG. 5 is another view of FIG. 4.
Figure 6:
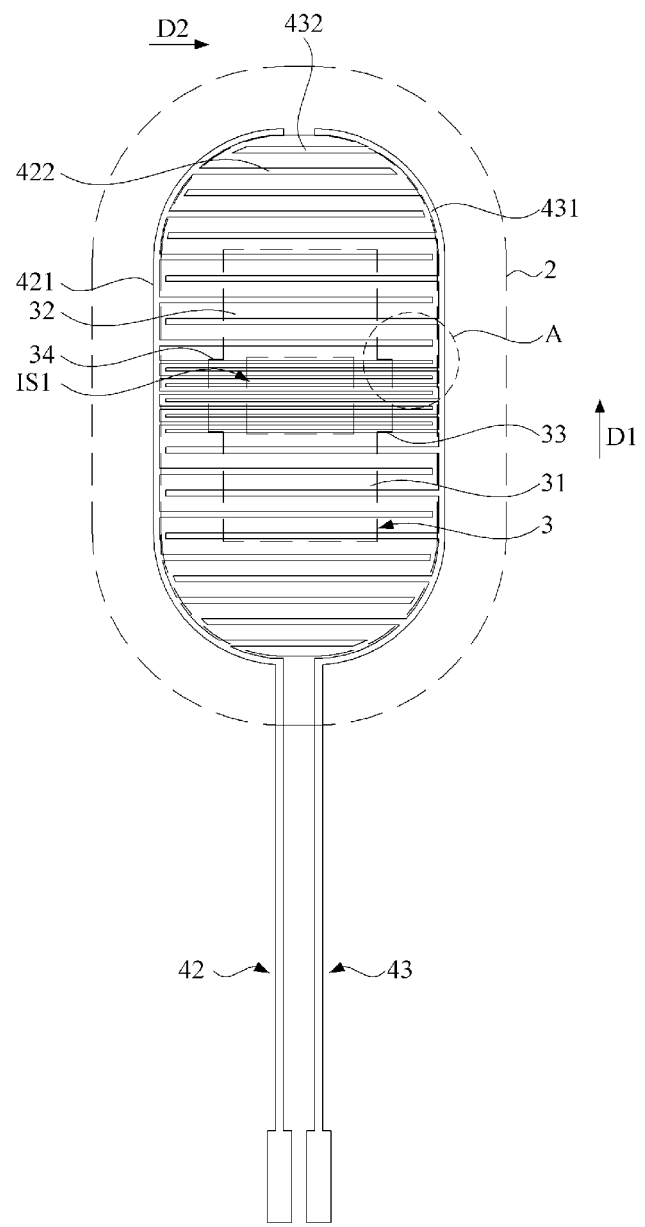
FIG. 6 demonstrates schematically and planarly relative position relationships between the sensor circuits and the spacers of the first embodiment of the pressure sensor of FIG. 4.
Figure 6A:
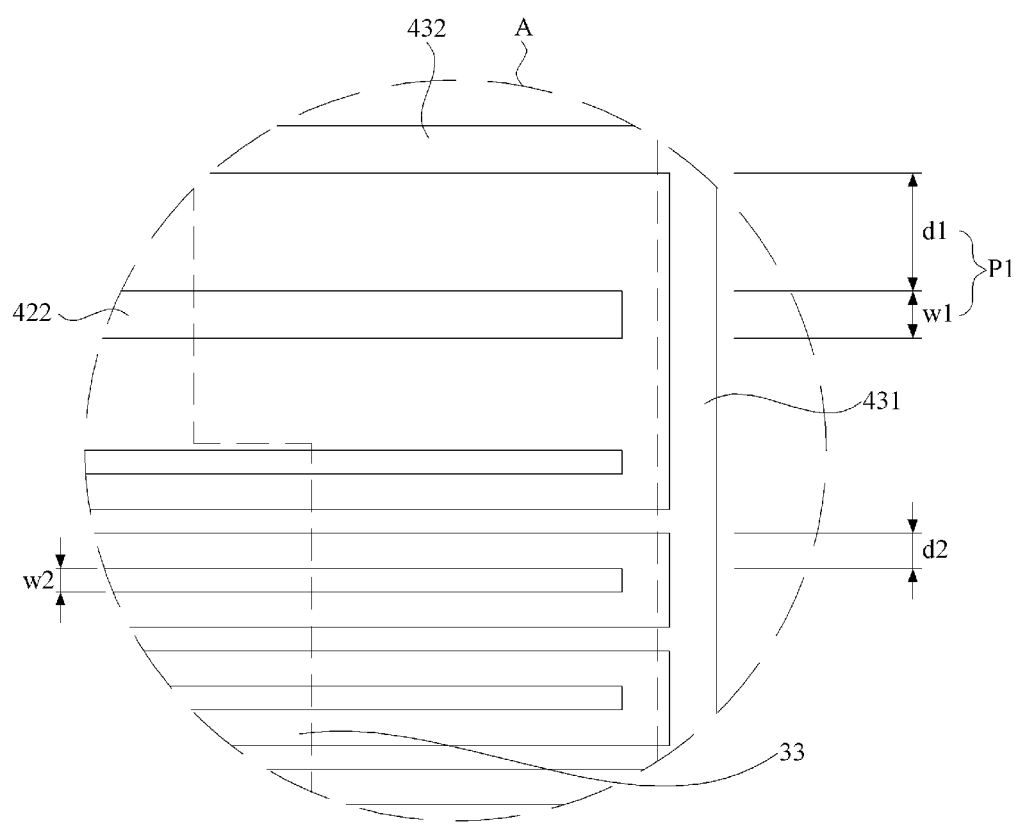
FIG. 6A is a schematic enlarged view of circle A of FIG. 6.

Refer now to FIG. 4 to FIG. 6A; where FIG. 4 is a schematic exploded view of a first embodiment of the pressure sensor in accordance with the present invention, FIG. 5 is another view of FIG. 4, FIG. 6 demonstrates schematically and planarly relative position relationships between the sensor circuits and the spacers of the first embodiment of the pressure sensor of FIG. 4, and FIG. 6A is a schematic enlarged view of circle A of FIG. 6.

As shown, the pressure sensor 100 includes a conductive substrate 1, a ring-shaped spacer 2, an inner spacer 3 and a sensing circuit substrate 4. The conductive substrate 1 includes a conductive-substrate body 11 and a conductive layer 12. The conductive-substrate body 11 has a conductive-layer disposing surface 111. The conductive layer 12, disposed on the conductive-layer disposing surface 111, has a central sensing region 121 and two outer sensing regions 122 and 123 located to opposing sides of the central sensing region 121. In this embodiment, the central sensing region 121 is closely adjacent to the two outer sensing regions 122 and 123.

The ring-shaped spacer 2, while being disposed on the conductive-substrate body 11, can expose the conductive layer 12 from a central empty space of the ring-shaped spacer 2. In this embodiment, the ring-shaped spacer 2 is to overlap part of the outer rim of the conductive layer 12, and to leave the rest of the conductive layer 12 to be exposed through the central empty space of the ring-shaped spacer 2. In other words, the central portion of the conductive layer 12 is not overlapped by the ring-shaped spacer 2. In some other embodiments not shown here, the inner rim of the ring-shaped spacer 2 can be flush with the outer rim of the conductive layer 12, or located side by side to each other. Anyhow, the conductive layer 12 is exposed within the ring-shaped spacer 2. In addition, a thickness of the ring-shaped spacer 2 would be far bigger that that of the conductive layer 12. Thereupon, no matter how big an area of the part of the conductive layer 12 is to be overlapped by a corresponding portion of the ring-shaped spacer 2, the portion of the conductive layer 12 that exposes out of the ring-shaped spacer 2 would never enter and pass through the central empty space of the ring-shaped spacer 2.

The inner spacer 3 includes a first-end portion 31, a second-end portion 32, a first lateral portion 33 and a second lateral portion 34. The first-end portion 31 and the second-end portion 32 are furnished to the outer sensing region 122 and the outer sensing region 123, respectively. The first lateral portion 33 and the second lateral portion 34, spaced to each other, are furnished to the central sensing region 121. The first-end portion 31, the second-end portion 32, the first lateral portion 33 and the second lateral portion 34 are integrated as a unique piece to associate the ring-shaped spacer 2 for forming three central sensing spaces IS1 (only one labeled in the figure) on the central sensing region 121. The first-end portion 31 and the second-end portion 32 are further paired individually with the ring-shaped spacer 2 so as to form two separated outer sensing spaces OS1 (only one labeled in the figure). These three central sensing spaces IS1 include the central closed sensing space formed by the first-end portion 31, the second-end portion 32, the first lateral portion 33 and the second lateral portion 34 and the two central lateral sensing spaces, one formed by the first lateral portion 33 and the ring-shaped spacer 2, and another formed by the second lateral portion 34 and the ring-shaped spacer 2. These two central lateral sensing spaces are further communicative with the two outer sensing spaces OS1.

The sensing circuit substrate 4, disposed on the ring-shaped spacer 2 and the inner spacer 3, includes a circuit-substrate body 41, a first sensing circuit 42 and a second sensing circuit 43.

The circuit-substrate body 41 has a circuit-disposing surface 411 facing the conductive-layer disposing surface 111 and disposed on the ring-shaped spacer 2 and the inner spacer 3. The circuit-substrate body 41 is extended from a first end 4111 to a second end 4112 in a first direction D1. Practically, the ring-shaped spacer 2 and the inner spacer 3 are adhered onto the conductive substrate 1, and the sensing circuit substrate 4 is adhered onto the ring-shaped spacer 2 and the inner spacer 3. Thereupon, the central sensing spaces IS1 and the outer sensing spaces OS1 formed by the ring-shaped spacer 2 and the inner spacer 3 would be sealed by the sensing circuit substrate 4 and the conductive substrate 1, so that a function of moisture proof can be obtained. In addition, though, in this embodiment, the ring-shaped spacer 2 and the inner spacer 3 are firstly adhered to the conductive substrate 1, and then the sensing circuit substrate 4 is adhered onto the ring-shaped spacer 2 and the inner spacer 3. However, in other embodiments, the ring-shaped spacer 2 and the inner spacer 3 can be firstly adhered to the sensing circuit substrate 4, and then the conductive substrate 1 is adhered to the ring-shaped spacer 2 and the inner spacer 3. Thereby, the same pressure sensor 100 as this embodiment can be produced as well.

The first sensing circuit 42 includes a first bus circuit 421 and a plurality of first finger circuits 422 (only one labeled in the figure). The first bus circuit 421 is disposed along a side of the circuit-disposing surface 411 by extending from a first end 4111 to a second end 4112. The first finger circuits 422 are individually extended out from the first bus circuit 421 in a second direction D2 perpendicular to the first direction D1, and distributed respectively in the central sensing region 121 and the two outer sensing regions 122 and 123.

The second sensing circuit 43 includes a second bus circuit 431 and a plurality of second finger circuits 432 (only one labeled in the figure). The second bus circuit 431 is disposed along another side of the circuit-disposing surface 411 by extending from the first end 4111 to the second end 4112. The second finger circuits 432 are individually extended out from the second bus circuit 431 in a direction reverse to the second direction D2 so as to be integrated into a staggered arrangement with the first finger circuits 422, and thereby distributed respectively in the central sensing region 121 and the two outer sensing regions 122 and 123.

In this embodiment, within the two outer sensing regions 122 and 123, the second finger circuits 432 and the first finger circuits 422 are arranged in the staggered manner with a first spacing d1. On the other hand, within the central sensing region 121, the second finger circuits 432 and the first finger circuits 422 are arranged also in a staggered manner with a second spacing d2. In addition, each of the first finger circuits 422 and the second finger circuits 432 within the two outer sensing regions 122 and 123 has a first width w1, while each of the first finger circuits 422 and the second finger circuits 432 within the central sensing region 121 has a second width w2. Further, in this embodiment, within any of the two outer sensing regions 122 and 123, a first pitch P1 is defined as the sum of the first width w1 (width of the local first finger circuit 422 or the local second finger circuit 432) and the neighboring first spacing d1 (spacing between the second finger circuits 432 and the first finger circuits 422). Also, within the central sensing region 121, a second pitch is defined as the sum of the second width w2 (width of the local first finger circuit 422 or the local second finger circuit 432) and the neighboring second spacing d2 (spacing between the local second finger circuits 432 and the local first finger circuits 422). In this embodiment, the first pitch P1 is greater than the second pitch, the first width w1 is greater than the second width w2, and the first spacing d1 is greater than the second spacing d2.

As described above, when the circuit-substrate body 41 is depressed, the first finger circuits 422 and the second finger circuits 432 would be pressed into the central sensing space IS1 or the outer sensing spaces OS1, and contact the conductive layer 12 if the depression is sufficient. Thereupon, the first finger circuits 422 and the second finger circuits 432 would be electrically connected. In this embodiment, since the inner spacer 3 is furnished with the central sensing space IS1 (including the aforesaid central closed sensing space and central lateral sensing spaces), the local first finger circuits 422 and second finger circuits 432 within the central sensing space IS1 are integrated into the staggered arrangement with the second spacing d2, and the local second width w2 is smaller than the first width w1 (i.e., a denser arrangement); so the sensing sensitivity of the pressure sensor 100 for high-pressure detections can be enhanced by the first finger circuits 422 and the second finger circuits 432 within the central sensing space IS1. Namely, in comparison with the conventional pressure sensor, the pressure sensor 100 of this embodiment can increase the variation percentage or the sensing sensitivity in a high-pressure detection by the dense-arranged first finger circuits 422 and second finger circuits 432 in the exposed area of the central sensing space IS1 restrained by the inner spacer 3 and the ring-shaped spacer 2.

In practical applications, as the pressure sensor 100 of this first embodiment is introduced to perform testing under a pressure range from 2 bar to 6 bar, the corresponding variation percentage would be about 58.4% (computed by (Pressure detected at 2 bar−Pressure detected at 6 bar)/(Pressure detected at 2 bar)). For testing under the pressure within 4~8 bar, the variation percentage would be about 36.5%.

Figure 7:
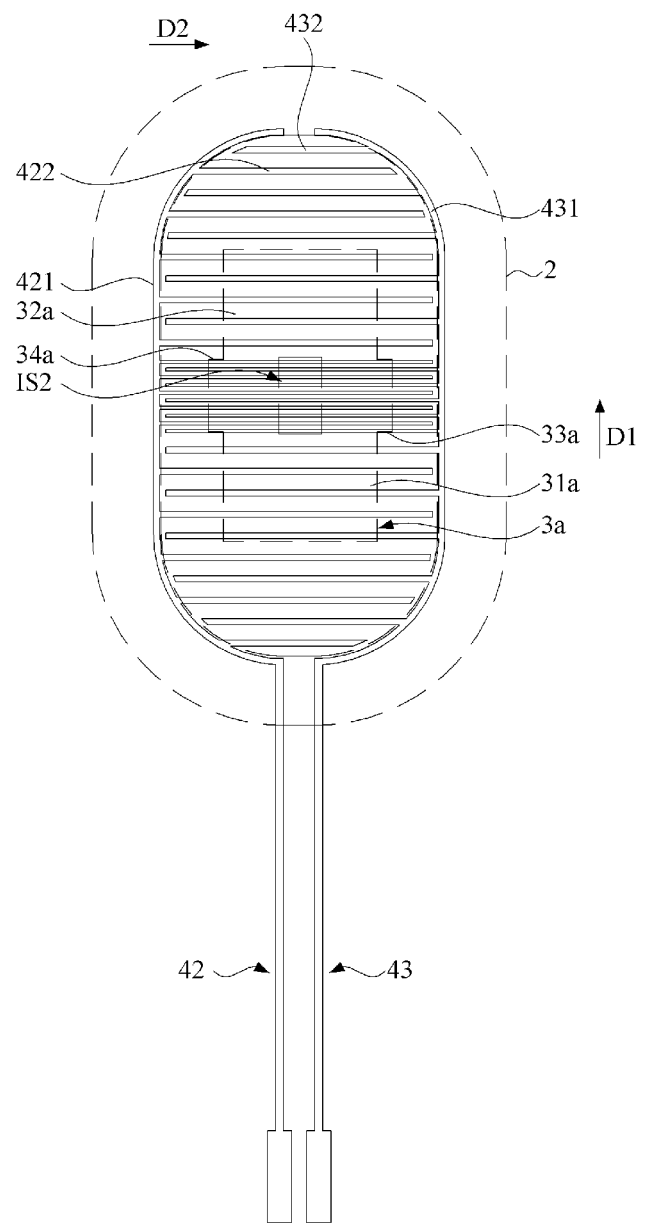
FIG. 7 demonstrates schematically and planarly relative position relationships between sensor circuits and spacers of a second embodiment of the pressure sensor in accordance with the present invention.

Referring now to FIG. 7, relative position relationships between sensor circuits and spacers of a second embodiment of the pressure sensor in accordance with the present invention are demonstrated schematically and planarly. As shown, in this embodiment, an inner spacer 3a is used to replace the inner spacer 3 of the aforesaid first embodiment. Similar to the aforesaid inner spacer 3, this inner spacer 3a has a first-end portion 31a, a second-end portion 32a, a first lateral portion 33a and a second lateral portion 34a. The first-end portion 31a, the second-end portion 32a, the first lateral portion 33a and the second lateral portion 34a are integrated as a unique piece to associate the ring-shaped spacer 2 for forming three central sensing spaces IS2 (only one labeled in the figure). The major difference between the inner spacer 3a and the inner spacer 3 is that the central closed sensing space (i.e., the central sensing space IS2) enclosed by the first-end portion 31a, the second-end portion 32a, the first lateral portion 33a and the second lateral portion 34a is about half in area of the central closed sensing space (i.e., the central sensing space IS1) enclosed by the first-end portion 31, the second-end portion 32, the first lateral portion 33 and the second lateral portion 34. In addition, in this embodiment, the area of the central closed sensing space (i.e., the central sensing space IS2) is approximately equal to that of the central lateral sensing spaces (also the central sensing space IS2) enclosed by the ring-shaped spacer 2 and the first lateral portion 33a or the second lateral portion 34a. Thus, in comparison with the aforesaid inner spacer 3, the inner spacer 3a of this embodiment provides a smaller exposed area of the first finger circuits 422 and the second finger circuits 432 to the inner spacer 3a and the ring-shaped spacer 2 due to an even denser arrangement. Though the variation percentage for high-pressure testing might be smaller than that in the previous first embodiment, yet the variation percentage for high-pressure testing in this second embodiment can be still higher than that in the conventional pressure sensor. It implies that the sensing sensitivity for high-pressure testing in this present invention can be adjusted by varying the exposed area of the dense-arranged first finger circuits 422 and second finger circuits 432 to the inner spacer 3a and the ring-shaped spacer 2.

In practical applications, as the pressure sensor of this second embodiment is introduced to perform testing under a pressure range from 2 bar to 6 bar, the corresponding variation percentage would be about 53.5% (computed by (Pressure detected at 2 bar−Pressure detected at 6 bar)/(Pressure detected at 2 bar)). For testing under the pressure within 4~8 bar, the variation percentage would be about 29.9%.

Figure 8:
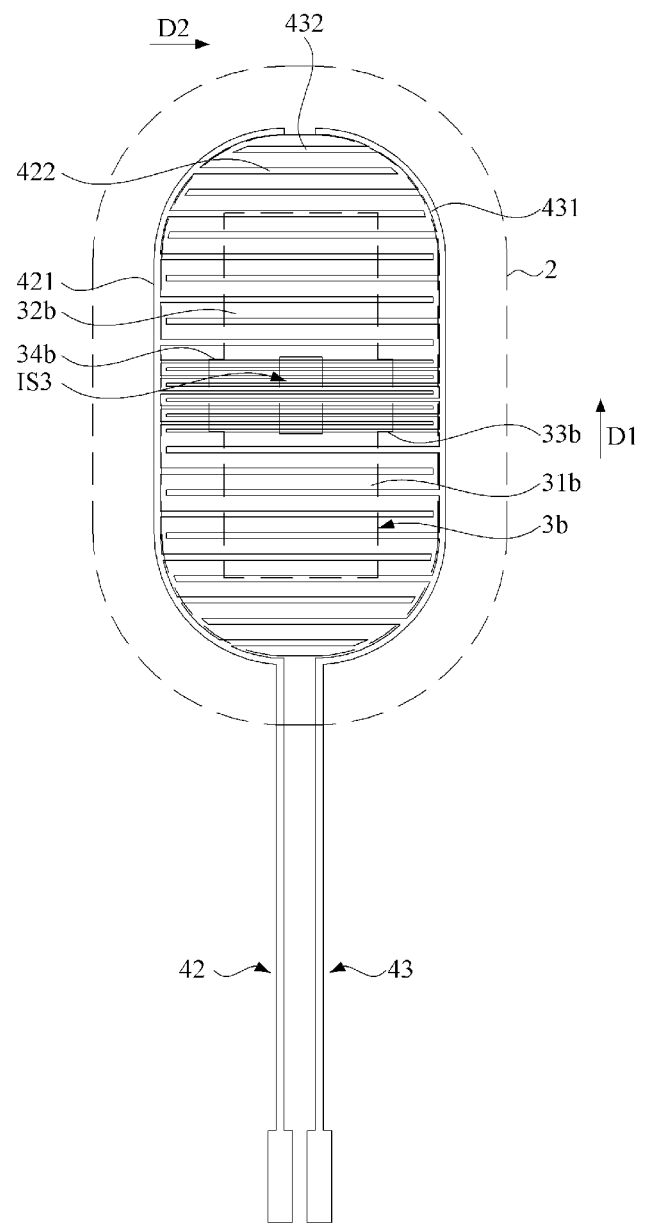
FIG. 8 demonstrates schematically and planarly relative position relationships between sensor circuits and spacers of a third embodiment of the pressure sensor in accordance with the present invention.

Referring now to FIG. 8, relative position relationships between sensor circuits and spacers of a third embodiment of the pressure sensor in accordance with the present invention are demonstrated schematically and planarly. As shown, in this embodiment, an inner spacer 3b is used to replace the inner spacer 3b of the aforesaid second embodiment. Similar to the aforesaid inner spacer 3a, this inner spacer 3b has a first-end portion 31b, a second-end portion 32b, a first lateral portion 33b and a second lateral portion 34b. The first-end portion 31b, the second-end portion 32b, the first lateral portion 33b and the second lateral portion 34b are integrated as a unique piece to associate the ring-shaped spacer 2 for forming three central sensing spaces IS3 (only one labeled in the figure). The major difference between the inner spacer 3b and the inner spacer 3a is that lengths of the first-end portion 31b and the second-end portion 32b in the first direction D1 are larger than the respective lengths of the first-end portion 31a and the second-end portion 32a in the first direction D1. It implies that, in this embodiment, the outer sensing spaces (not shown in the figure) enclosed by the ring-shaped spacer 2 and the first-end portion 31b and the second-end portion 32b are smaller than the outer sensing spaces (not shown in the figure) enclosed by the ring-shaped spacer 2 and the first-end portion 31a and the second-end portion 32a. Thus, the reduction in the exposed area of the first finger circuits 422 and the second finger circuits 432 to the inner spacer 3b and the ring-shaped spacer 2 due to a less denser arrangement would lift up a start-up pressure.

In practical applications, as the pressure sensor of this third embodiment is introduced to perform testing under a pressure range from 2 bar to 6 bar, the corresponding variation percentage would be about 57% (computed by (Pressure detected at 2 bar−Pressure detected at 6 bar)/(Pressure detected at 2 bar)). For testing under the pressure within 4~8 bar, the variation percentage would be about 32%.

Figure 9:
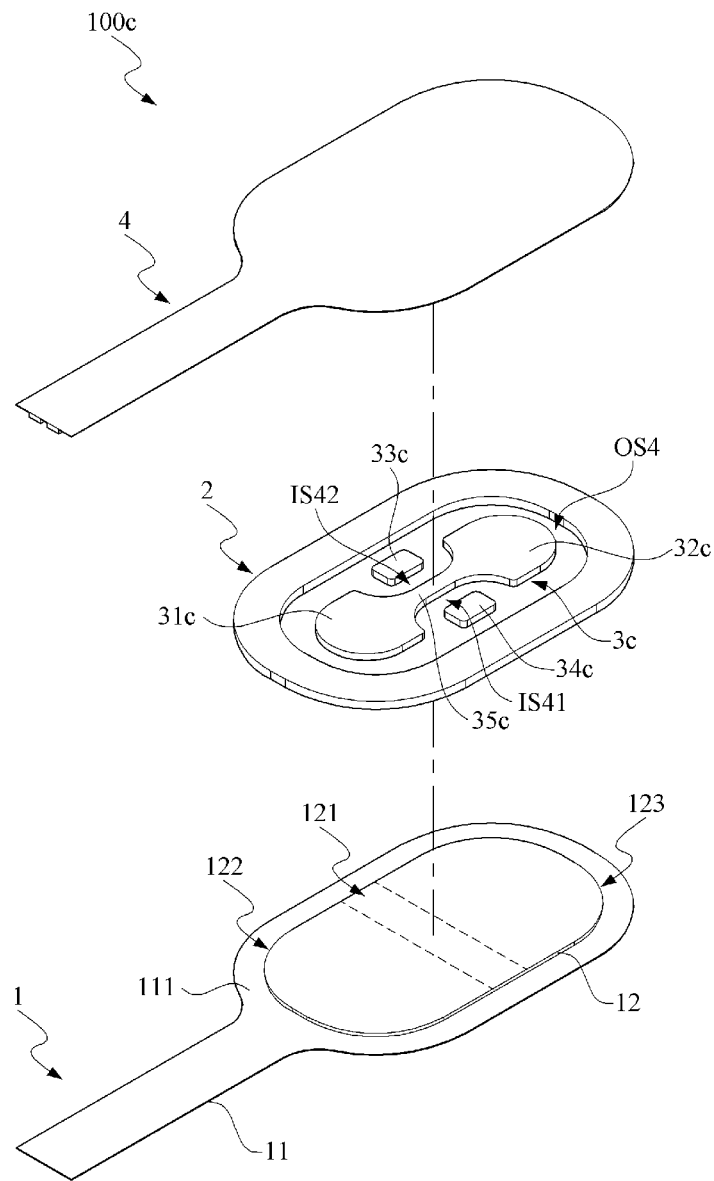
FIG. 9 is a schematic exploded view of a fourth embodiment of the pressure sensor in accordance with the present invention.
Figure 10:
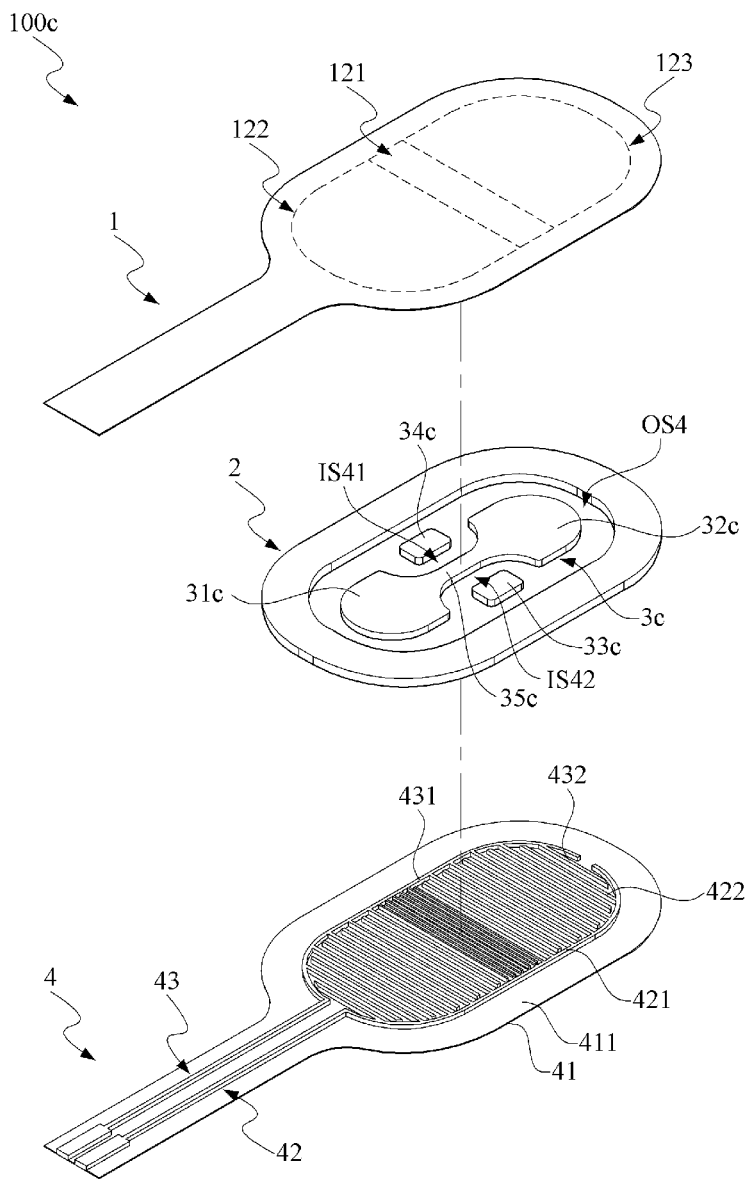
FIG. 10 is another view of FIG. 9.
Figure 11:
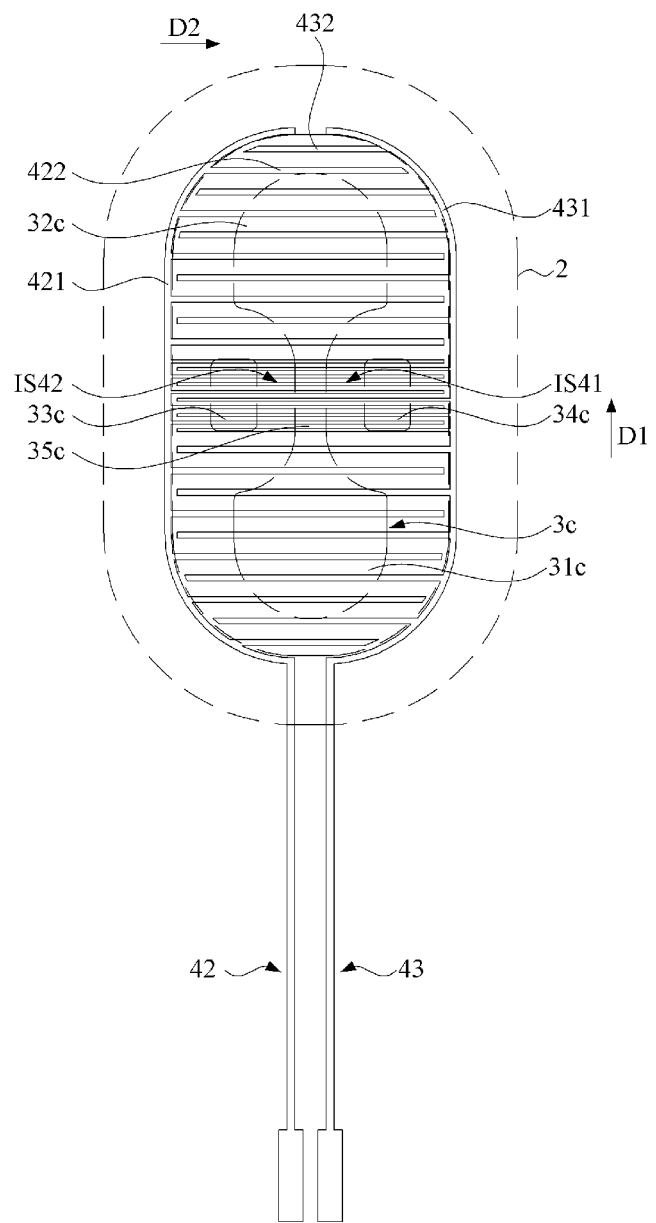
FIG. 11 demonstrates schematically and planarly relative position relationships between the sensor circuits and the spacers of the fourth embodiment of the pressure sensor of FIG. 9.

Refer now to FIG. 9 to FIG. 11; where FIG. 9 is a schematic exploded view of a fourth embodiment of the pressure sensor in accordance with the present invention, FIG. 10 is another view of FIG. 9, and FIG. 11 demonstrates schematically and planarly relative position relationships between the sensor circuits and the spacers of the fourth embodiment of the pressure sensor of FIG. 9.

As shown, in this embodiment, a pressure sensor 100c is largely resembled to the pressure sensor 100 of the first embodiment, and the major difference in between is that, in the pressure sensor 100c, an inner spacer 3c is used to replace the inner spacer 3 of the aforesaid first embodiment. Similar to the aforesaid inner spacer 3, this inner spacer 3c has a first-end portion 31c, a second-end portion 32c, a first lateral portion 33c, a second lateral portion 34c and a central portion 35c. The first-end portion 31c and the second-end portion 32c are disposed on the outer sensing regions 122, 123, respectively. The first lateral portion 33c and the second lateral portion 34c are separately disposed on opposing sides of the central sensing region 121. The central portion 35c is also disposed on the central sensing region 121 to separate spatially the first lateral portion 33c and the second lateral portion 34c. The central portion 35c, the first-end portion 31c and the second-end portion 32c are further integrated as a unique piece so as to have the first-end portion 31c, the second-end portion 32c, the first lateral portion 33c, the second lateral portion 34c and the central portion 35c to define two central sensing spaces IS41 (only one labeled in the figure) and two central sensing spaces IS42 (only one labeled in the figure) on the central sensing region 121. In addition, with the ring-shaped spacer 2, the first-end portion 31c, the second-end portion 32c, the first lateral portion 33c, the second lateral portion 34c and the central portion 35c, two outer sensing spaces OS4 (only one labeled in the figure) are further defined separately. In particular, the two outer sensing spaces OS4 further connect spatially with the two central sensing spaces IS41 and the two central sensing spaces IS42.

In this embodiment, by providing the central portion 35c, the exposed area of the first finger circuits 422 and the second finger circuits 432 to the central sensing region 121 is further reduced. Since the first-end portion 31c and the second-end portion 32c match the configuration of the ring-shaped spacer 2, thus the exposed area of the less dense-arranged first finger circuits 422 and second finger circuits 432 to the outer sensing regions 122 and 123 is reduced, such that the inclusion of the inner spacer 3c can increase the sensing sensitivity for high-pressure testing. However, since the exposed area of the first finger circuits 422 and the second finger circuits 432 to the inner spacer 3c is decreased, thus the start-up pressure is increased.

In practical applications, as the pressure sensor 100c of this embodiment is introduced to perform testing under a pressure range from 2 bar to 6 bar, the corresponding variation percentage would be about 57% (computed by (Pressure detected at 2 bar–Pressure detected at 6 bar)/(Pressure detected at 2 bar)). For testing under the pressure within 4~8 bar, the variation percentage would be about 37%.

Figure 12:
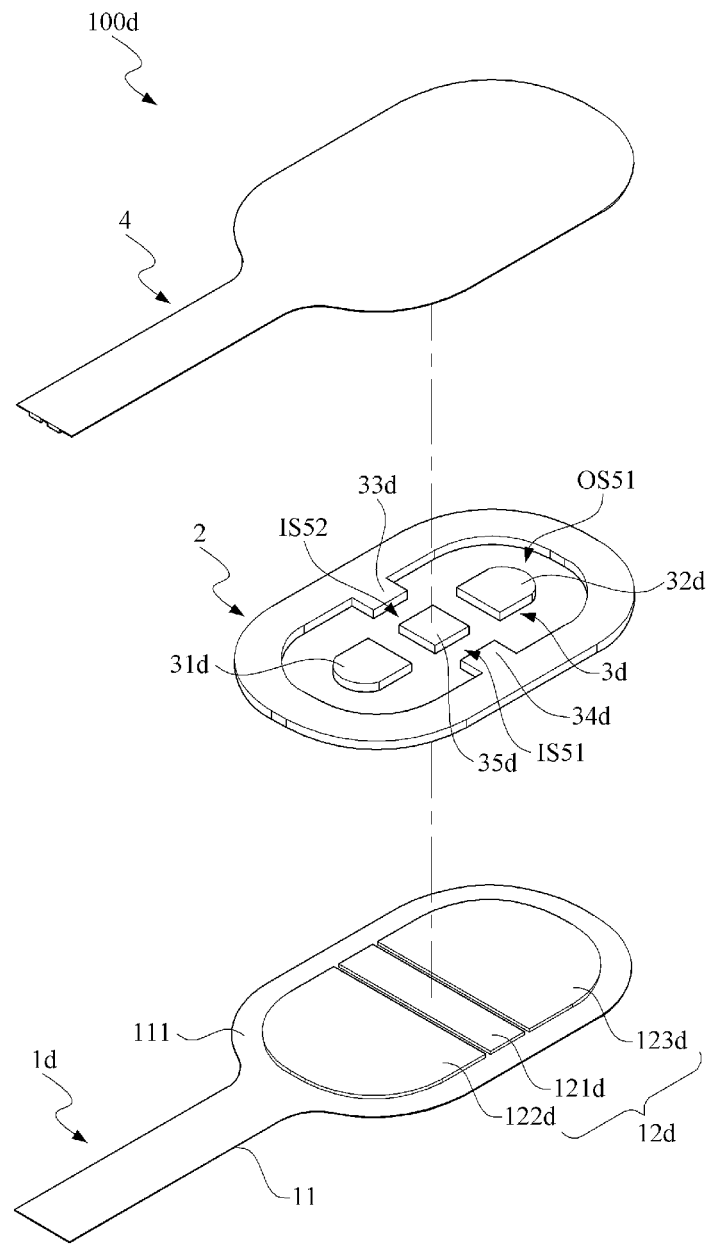
FIG. 12 is a schematic exploded view of a fifth embodiment of the pressure sensor in accordance with the present invention.
Figure 13:
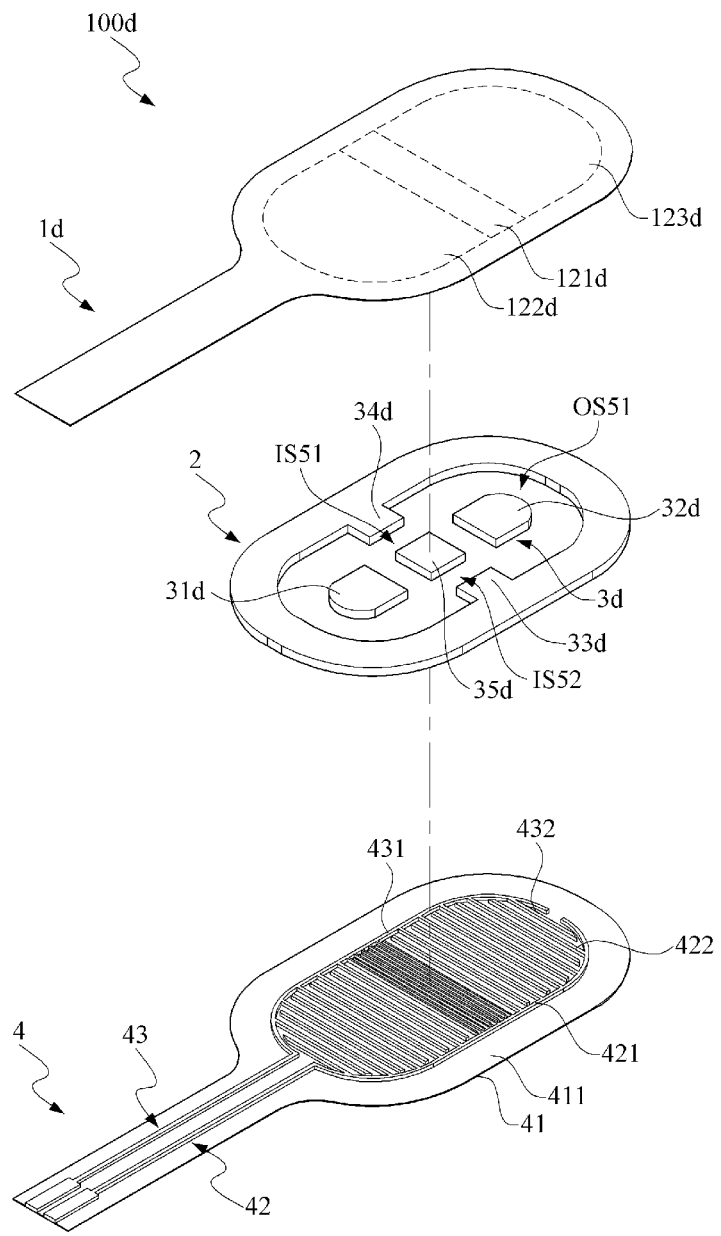
FIG. 13 is another view of FIG. 12.
Figure 14:
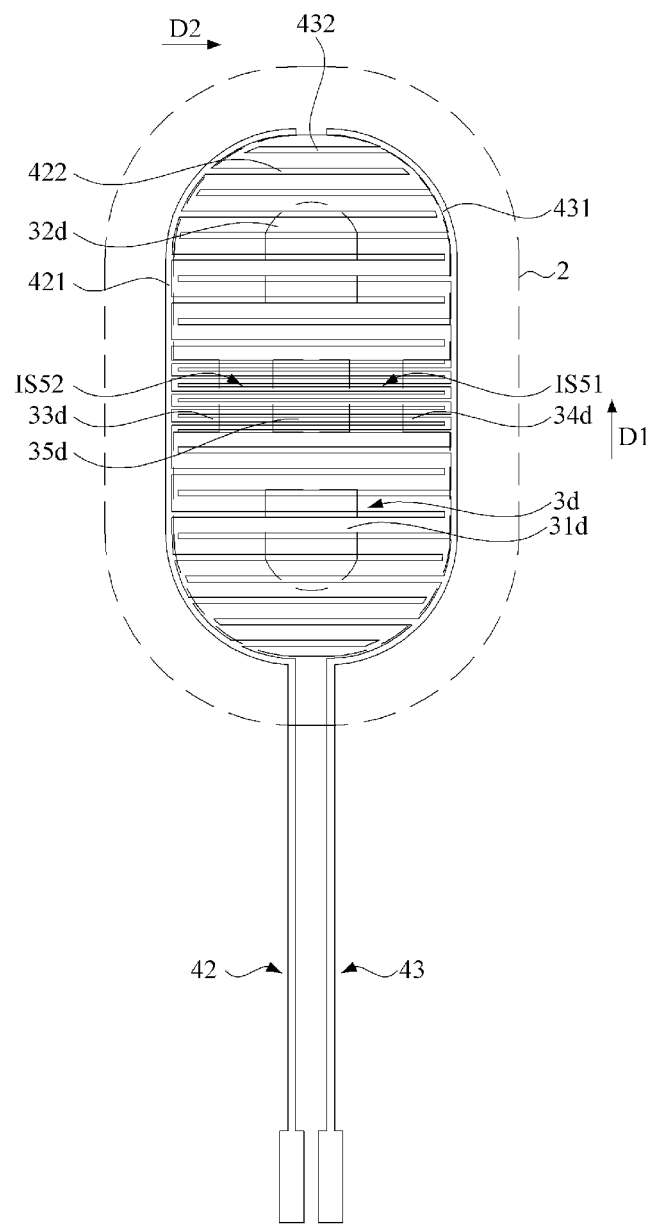
FIG. 14 demonstrates schematically and planarly relative position relationships between the sensor circuits and the spacers of the fifth embodiment of the pressure sensor of FIG. 12.

Refer now to FIG. 12 to FIG. 14; where FIG. 12 is a schematic exploded view of a fifth embodiment of the pressure sensor in accordance with the present invention, FIG. 13 is another view of FIG. 12, and FIG. 14 demonstrates schematically and planarly relative position relationships between the sensor circuits and the spacers of the fourth embodiment of the pressure sensor of FIG. 12.

As shown, in this embodiment, the pressure sensor 100d is largely resembled to the pressure sensor 100 of the first embodiment or the pressure sensor 100c of the fourth embodiment, and the major difference in between is that, in this embodiment, the pressure sensor 100d introduces a conductive substrate 1d to replace the conductive substrate 1 of the first embodiment, and an inner spacer 3d to replace the inner spacer 3c of the fourth embodiment.

In this embodiment, the conductive substrate 1d includes a conductive-substrate body 11 and a conductive layer 12d. The conductive layer 12d, disposed on the conductive-layer disposing surface 111 of the conductive-substrate body 11, has a central sensing region 121d and two outer sensing regions 122d and 123d located to opposing sides of the central sensing region 121d. In this embodiment, the central sensing region 121d is disposed in a separate manner between the two outer sensing regions 122d and 123d.

The inner spacer 3d includes a first-end portion 31d, a second-end portion 32d, a first lateral portion 33d, a second lateral portion 34d and a central portion 35d. The first-end portion 31d and the second-end portion 32d are disposed on the outer sensing regions 122d, 123d, respectively. The first lateral portion 33d and the second lateral portion 34d are separately disposed on the central sensing region 121d, but connect individually as a unique piece with the ring-shaped spacer 2. The central portion 35d, disposed on the central sensing region 121d, is located separately in the middle of the first-end portion 31d, the second-end portion 32d, the first lateral portion 33d and the second lateral portion 34d, so that the first-end portion 31d, the second-end portion 32d, the first lateral portion 33d, the second lateral portion 34d and the central portion 35d can define two central sensing spaces IS51 and IS52 on the central sensing region 121d. In addition, with the ring-shaped spacer 2, the first-end portion 31d, the second-end portion 32d, the first lateral portion 33d, the second lateral portion 34d and the central portion 35d are together to define separately two outer sensing spaces OS51 and OS52.

In this embodiment, the two outer sensing spaces OS51 and OS52 are connected spatially with the two central sensing spaces IS51 and IS52, respectively. Since the central sensing region 121d and the outer sensing regions 122d and 123d are all separated, and further the exposed area of the dense-arranged first finger circuits 422 and second finger circuits 432 to the central sensing region 121d is comparatively small, thus the variation percentage of the pressure sensor 100d for high-pressure testing cannot be significantly increased. Nevertheless, for the exposure of the dense-arranged first finger circuits 422 and second finger circuits 432 to the two central sensing spaces IS51 and IS52, the variation percentage of the pressure sensor 100d for high-pressure testing is still superior to that of the conventional pressure sensor.

In practical applications, as the pressure sensor 100d of this embodiment is introduced to perform testing under a pressure range from 2 bar to 6 bar, the corresponding variation percentage would be about 38% (computed by (Pressure detected at 2 bar–Pressure detected at 6 bar)/(Pressure detected at 2 bar)). For testing under the pressure within 4~8 bar, the variation percentage would be about 25%.

In summary, though the conventional pressure sensor applied a staggered arrangement for disposing the first finger circuits and the second finger circuits, yet the same width and spacing are utilized, and also the area of the first finger circuits and the second finger circuits overlapped by the inner spacer is too big to make significantly the variation percentage of the conventional pressure sensor for high-pressure testing. On the other hand, the pressure sensor provided by the present invention divides the conductive layer into the central sensing region and the outer sensing regions located at opposing sides of the central sensing region, and introduces the inner spacer to form at least one central sensing spaces. Upon such an arrangement, as an object to be tested touches and applies an depression upon the pressure sensor of the present invention, even a slight pressure would have the conductive-substrate body to approach the circuit-substrate body within the outer sensing region, for the outer sensing region is larger than the central sensing region. Further, the first finger circuits and the second finger circuits respective to the outer sensing region contacts the conductive layer to establish the electric connection. Also, since the central sensing region is smaller than the outer sensing region, thus, as the applied pressure provided by the object to be tested reach a predetermined level, the conductive-substrate body and the circuit-substrate body within the central sensing region would approach each other to have the first finger circuits and the second finger circuits to contact the conductive layer, and thus a corresponding electric connection can be established. Namely, the pressure sensor provided by the present invention utilizes the broader outer sensing regions to lower the start-up pressure, and the smaller central sensing region to increase the detection range of the pressure sensor.

As described above, since the present invention further arranges the first finger circuits and the second finger circuits on the outer sensing regions in one staggered manner with one first width and one first spacing, and those on the central sensing region in another staggered manner with a second width smaller than the first width and a second spacing smaller than the first spacing (i.e., a denser staggered arrangement for the first finger circuits and the second finger circuits on the central sensing region, and a less dense staggered arrangement for those on the outer sensing regions), thus the sensing sensitivity for both lower-pressure and high-pressure testing can be enhanced simultaneously.

Further, in detail, when the object to be tested is placed on the pressure sensor of the present invention, a pressure can be easily detected for the less dense staggered arrangement and the broader sensing area for the first finger circuits and the second finger circuits located close to lateral sides of the pressure sensor (i.e., a lower start-up pressure). When the object to be tested applies a larger pressure upon the pressure sensor of the present invention, and since the first finger circuits and the second finger circuits are densely arranged in the central area of the pressure sensor, thus the pressure upon the object to be tested is hard to depress the first finger circuits and the second finger circuits (or the conductive layer) down to deflect through the central sensing region to touch the conductive layer (or the first finger circuits and the second finger circuits), and thereby the variation percentage of the pressure sensor for high-pressure testing according to the present invention can be increased. Since the first finger circuits and the second finger circuits are arranged densely in the central sensing region of the pressure sensor and less densely in the outer sensing regions thereof, the sensing sensitivity for both lower-pressure and high-pressure testing can be enhanced simultaneously.

While the present invention has been particularly shown and described with reference to a preferred embodiment, it will be understood by those skilled in the art that various changes in form and detail may be without departing from the spirit and scope of the present invention.

We claim:

1. A pressure sensor, comprising:
   a conductive substrate, including:
     a conductive-substrate body, having a conductive-layer disposing surface; and
     a conductive layer, disposed on the conductive-layer disposing surface, and having a central sensing region and two outer sensing regions separately located at two opposing sides out of the central sensing region;
   a ring-shaped spacer, disposed on the conductive-substrate body to make the conductive layer exposed therefrom;
   an inner spacer, disposed on the conductive layer, separated from the ring-shaped spacer to form two outer sensing spaces exposed respectively from the two outer sensing regions and at least one central sensing space exposed from the central sensing region; and
   a sensing circuit substrate, disposed on the ring-shaped spacer and the inner spacer, including:
     a circuit-substrate body, extending from a first end to a second end in a first direction, having a circuit-disposing surface facing the conductive-layer disposing surface and disposed on the ring-shaped spacer and the inner spacer;
     a first sensing circuit, including:
       a first bus circuit, disposed along a side of the circuit-disposing surface by extending from the first end to the second end; and
       a plurality of first finger circuits, extending individually out from the first bus circuit in a second direction perpendicular to the first direction, distributed respectively in the central sensing region and the two outer sensing regions; and
     a second sensing circuit, including:
       a second bus circuit, disposed along another side of the circuit-disposing surface by extending from the first end to the second end; and
       a plurality of second finger circuits, extending individually out from the second bus circuit in a direction reverse to the second direction to be integrated into a staggered arrangement with the first finger circuits, distributed respectively in the central sensing region and the two outer sensing regions;
   wherein an arrangement density of the first finger circuits and the second finger circuits in the central sensing region is larger than that in the two outer sensing regions.

2. The pressure sensor of claim 1, wherein the inner spacer includes a first-end portion, a second-end portion, a first lateral portion and a second lateral portion, the first-end portion and the second-end portion are respectively furnished to the two outer sensing regions, the first lateral portion and the second lateral portion are furnished to the central sensing region by spacing to each other, and the at least one central sensing space is enclosed on the central sensing region by the first-end portion, the second-end portion, the first lateral portion, the second lateral portion and the ring-shaped spacer.

3. The pressure sensor of claim 2, wherein the first lateral portion and the second lateral portion are individually integrated as a unique piece with the first-end portion and the second-end portion, respectively.

4. The pressure sensor of claim 2, wherein the inner spacer further includes a central portion located separately between the first lateral portion and the second lateral portion.

5. The pressure sensor of claim 4, wherein the central portion is further integrated as a unique piece with the first-end portion and the second-end portion.

6. The pressure sensor of claim 1, wherein the second finger circuits and the first finger circuits in the two outer sensing regions are integrated into the staggered arrangement with a first spacing distance, and the second finger circuits and the first finger circuits in the central sensing region are integrated into the staggered arrangement with a second spacing distance smaller than the first spacing distance.

7. The pressure sensor of claim 1, wherein each of the second finger circuits and the first finger circuits in the two outer sensing regions has a first width, each of the second finger circuits and the first finger circuits in the central sensing region has a second width, and the second width is smaller than the first width.

* * * * *